United States Patent [19]
Sakata et al.

[11] Patent Number: 5,036,199
[45] Date of Patent: Jul. 30, 1991

[54] LIQUID CRYSTAL CHOPPER AND INFRARED SENSOR

[75] Inventors: Masakazu Sakata; Kenichi Shibata; Kousuke Takeuchi, all of Hirakata; Toshiharu Tanaka, Higashiosaka; Hiroshi Okano, Hirakata; Toshikazu Tsujino, Sakai; Kazuhiko Kuroki, Uji, all of Japan

[73] Assignee: Sanyo Electric Co., Ltd., Moriguchi, Japan

[21] Appl. No.: 481,277

[22] Filed: Feb. 20, 1990

[30] Foreign Application Priority Data

| Feb. 20, 1989 | [JP] | Japan | 1-18623[U] |
| Jul. 19, 1989 | [JP] | Japan | 1-187667 |
| Jul. 20, 1989 | [JP] | Japan | 1-190082 |
| Sep. 21, 1989 | [JP] | Japan | 1-245689 |
| Oct. 20, 1989 | [JP] | Japan | 1-123391[U] |

[51] Int. Cl.$^5$ .............................................. G02F 1/13
[52] U.S. Cl. ................................ 250/351; 250/338.3; 350/331 T
[58] Field of Search ........................... 250/338.3, 351; 350/351, 331 T, 347 V

[56] References Cited

U.S. PATENT DOCUMENTS

| 4,066,334 | 1/1978 | Fray et al. | 350/336 |
| 4,849,634 | 7/1989 | Riedl | 250/330 |

Primary Examiner—Carolyn E. Fields
Assistant Examiner—Drew A. Dunn
Attorney, Agent, or Firm—Armstrong, Nikaido, Marmelstein, Kubovcik & Murray

[57] ABSTRACT

A liquid crystal chopper comprising a pair of electrically conductive substrates, a spacer keeping the substrates so as to define a space between the substrates, and a liquid crystal of DSM type which is enclosed in the space, with a dielectric anisotropy of $-0.5$ or more and not exceeding 0. An infrared sensor using the liquid crystal chopper in the above construction as a chopper mechanism to intermittently interrupt infrared rays incident upon the pyroelectric element. The infrared sensor has a short response time at the liquid crystal chopper and consumes less power.

11 Claims, 11 Drawing Sheets

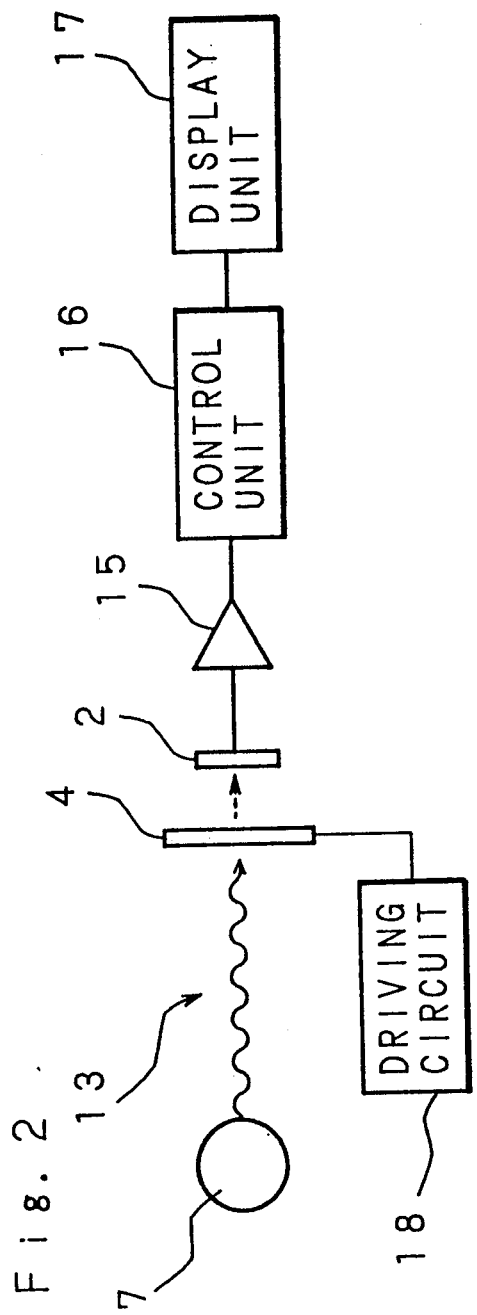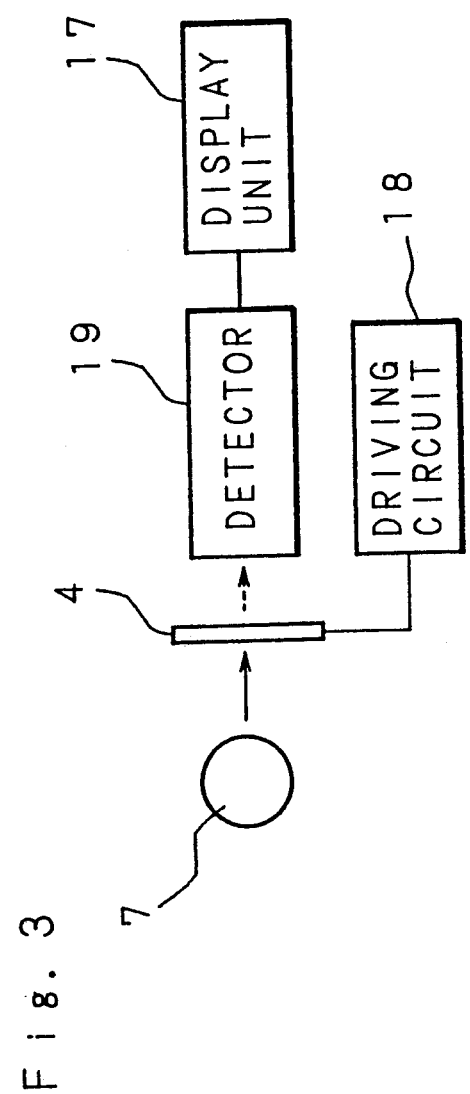

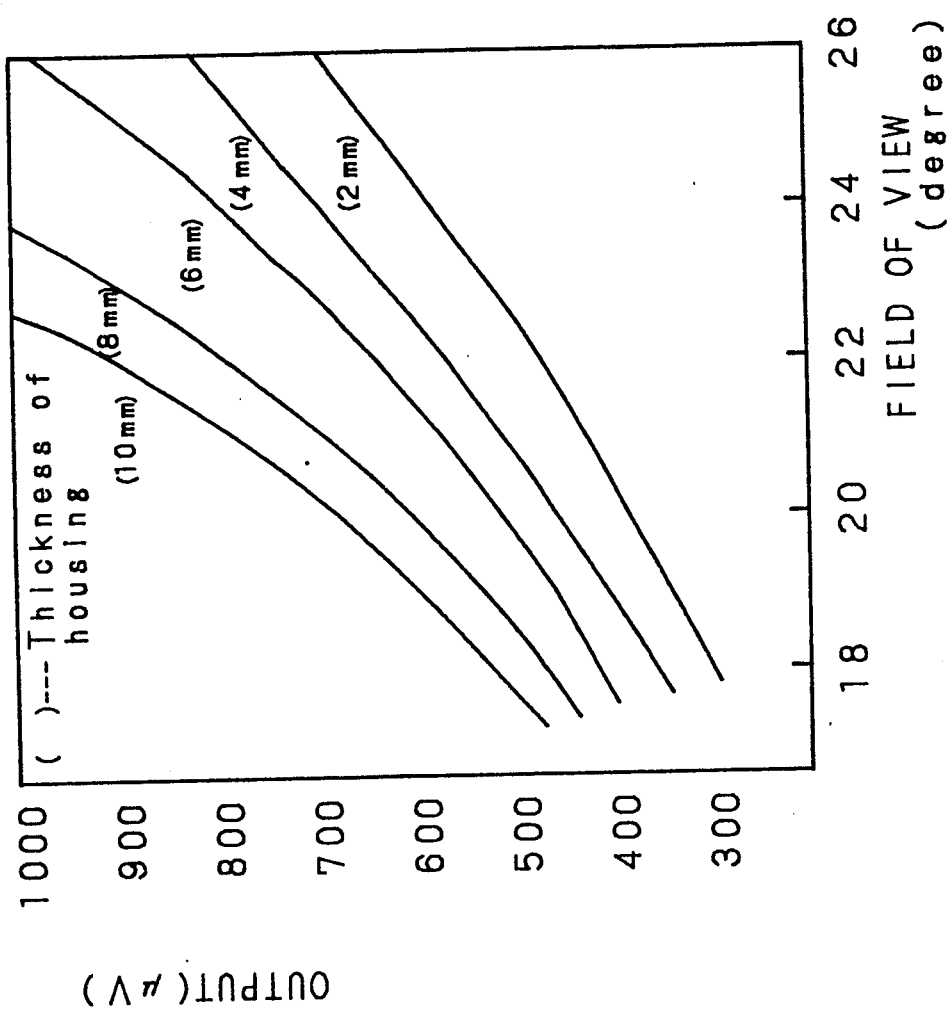

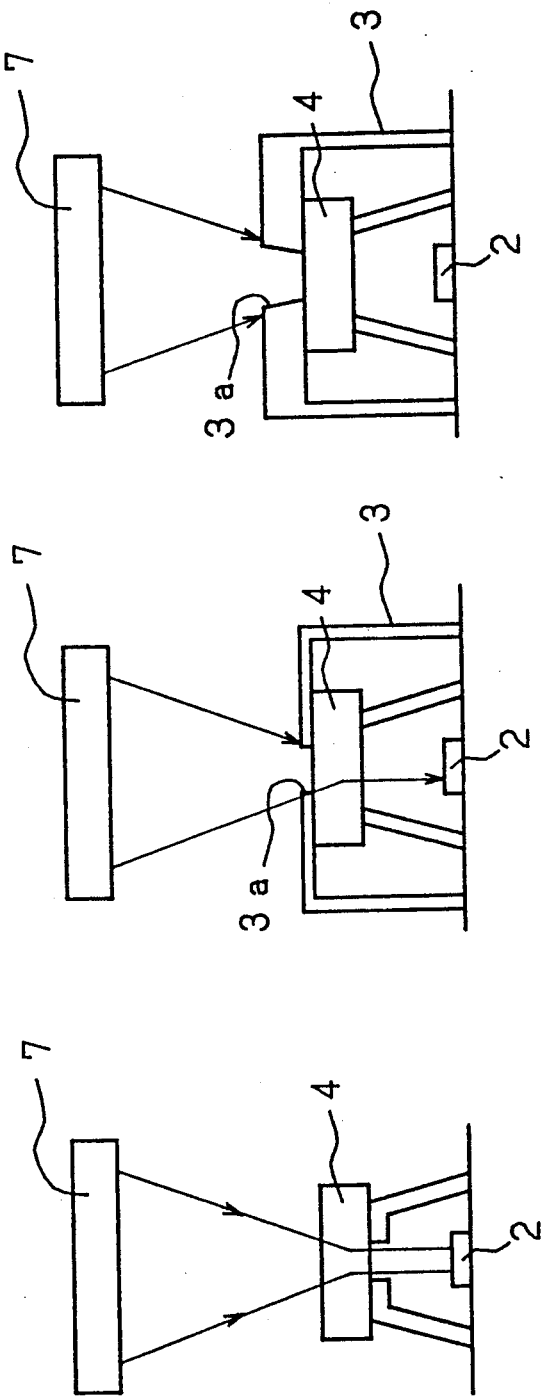

LIQUID CRYSTAL CHOPPER AND INFRARED SENSOR

BACKGROUND OF THE INVENTION

1. Field of the Invention

The present invention relates to an infrared sensor designed to detect infrared rays with the use of a pyroelectric element and also to a liquid crystal chopper for use in such infrared sensor or the like.

2. Description of Related Art

In an infrared sensor employing a pyroelectric element, a chopper mechanism is required to intermittently cut the infrared rays incident upon the pyroelectric element, so that an output indicative of the detection of infrared rays from the pyroelectric element is continuously obtained. For the chopper mechanism mentioned above, conventionally, a vane-shaped rotary body or vibrating element, etc. has been used. However, this kind of chopper mechanism is disadvantageously bulky in structure and high in cost, with consuming a large amount of electric power.

On the other hand, a liquid crystal shutter has been noted as the chopper mechanism which is stationary and able to be rendered compact in size. For example, Japanese Patent Application Laid-Open No. 62-23412 discloses a liquid crystal chopper of TN (twisted nematic) type. This liquid crystal chopper of TN type is, when it is utilized as a chopper, not free from such a drawback as a long response time (particularly, a fall time). Moreover, the TN-type liquid crystal chopper needs a deflecting plate for infrared rays (wavelength of approximately 3μm–12 μm), which plate is considerably expensive.

SUMMARY OF THE INVENTION

A liquid crystal chopper according to the present invention is comprised of a pair of electrically conductive substrates provided opposite to each other, a spacer keeping the pair of electrically conductive substrates at a pre-determined distance thereby defining a space, and a liquid crystal of DSM (dynamic scattering mode) type enclosed within the space and having a dielectric anisotropy of −0.5 or more and not exceeding 0. The electrically conductive substrates may be made of silicon or germanium and the liquid crystal may be made of para-azoxyanisole.

Moreover, according to the present invention, various arrangements are made in an infrared sensor which uses a liquid crystal chopper for intermittently interrupting the infrared rays incident upon a pyroelectric element, wherein the liquid crystal chopper is comprised of a pair of electrically conductive substrates provided opposite to each other, a spacer keeping the electrically conductive substrates at a predetermined distance thereby defining a space, a liquid crystal enclosed within the space. In this case of infrared sensor, the operating mode of the liquid crystal may either DSM type or TN type.

In the first place, at least one of a pair of the electrically conductive substrates is formed convex. Accordingly, the infrared rays can be focused onto the pyroelectric element, whereby the amount of infrared rays incident upon the pyroelectric element is made greatly different between when a voltage is applied to the electrically conductive substrates and when no voltage is applied thereto.

The application of voltage, namely, a cycle of positive voltage, 0 voltage, negative and 0 voltage is repeated by a predetermined number of times in the electrically conductive substrates of the liquid crystal chopper. The number of cycles is determined in relation to the sensitivity of the pyroelectric element. Thus, a large difference in the permeability of infrared rays can be found between when infrared rays pass through the liquid crystal chopper and when infrared rays are interrupted by the liquid crystal chopper.

Moreover, one of the electrically conductive substrates at the side of the pyroelectric element is grounded. Therefore, noises produced by the operation of the liquid crystal chopper can be reduced by the earthed portion, without overlapping with output signals.

The pyroelectric element and liquid crystal chopper are enclosed by a housing which is provided with a window so as to guide infrared rays therethrough via the liquid crystal chopper onto the pyroelectric element. The thickness of the housing where the window is formed is made as large as possible so long as the pyroelectric element can perceive the infrared rays, whereby outputs at the pyroelectric element can be improved.

One object of the present invention is to provide a liquid crystal chopper which realizes a chopper mechanism compact in size and small in power consumption.

A further object of the present invention is to provide a liquid crystal chopper which has a short response time and requires no deflecting plate and consequently reduces the manufacturing cost.

A still further object of the present invention is to provide an infrared sensor wherein at least one of a pair of electrically conductive substrates is formed convex, so that a compact structure with large outputs and small power consumption as compared with a conventional sensor can be achieved.

A yet another object of the present invention is to provide an infrared sensor wherein electrically conductive substrates of a liquid crystal chopper are applied with a voltage by a predetermined pattern described earlier, so that high outputs can be taken out stably at the pyroelectric element.

A yet further object of the present invention is to provide an infrared sensor wherein an electrically conductive substrate at the side of a pyroelectric element is earthed so that a high level output with high S/N ratio can be stably obtained, with improving the detecting accuracy.

A still another object of the present invention is to provide an infrared sensor wherein a window as mentioned above is formed in a housing, so that an output from a pyroelectric element can be large as compared with in a conventional infrared sensor.

The above and further objects and features of the invention will more fully be apparent from the following detailed description with accompanying drawings.

BRIEF DESCRIPTION OF THE DRAWINGS

FIG. 2 is a diagram of an infrared sensor employing the liquid crystal chopper according to the present invention, FIG. 3 is a diagram of a system which detects the transmission characteristics of the liquid chopper according to the present invention, FIG. 11 is a graph showing an output characteristic when the thickness of a housing is changed, and FIGS. 12(a), 12(b) and 12(c) are sectional views showing three kinds of infrared sensors.

DESCRIPTION OF THE PREFERRED EMBODIMENTS

The present invention will be discussed hereinbelow more in detail with reference to the accompanying drawings taken in conjunction with preferred embodiments thereof.

Figure 1A:
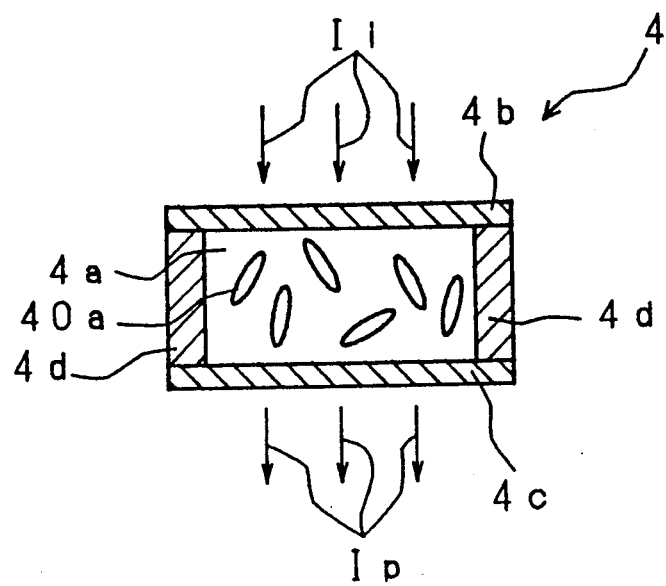
FIG. 1(a) and FIG. 1(b) are diagrams explanatory of the operating principle of a liquid crystal chopper according to the present invention.
Figure 1B:
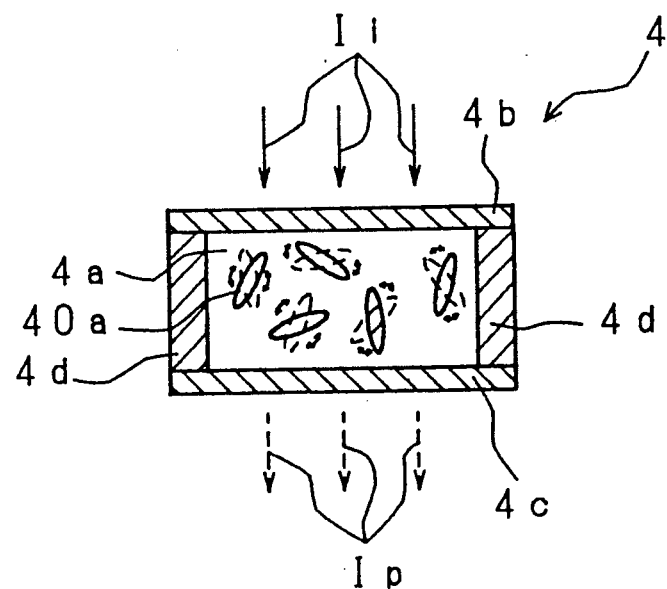

Referring first to FIG. 1, a liquid crystal chopper 4 according to the present invention is comprised of a pair of electrically conductive substrates 4b, 4c which are conductive silicon substrates allowing infrared rays to pass therethrough, a spacer 4d keeping the substrates 4b, 4c at a predetermined distance thereby to define a space therebetween, and a liquid crystal 4a enclosed within the space. Reference 40a represents a molecule of the liquid crystal.

The liquid crystal 4a is operated in DSM (dynamic scattering mode) and made of a para-azoxyanisole (NP-4, NP-5; produced by Merk Japan, Co., Ltd.). The dielectric anistropy $\Delta\epsilon$ of molecules 40a of the liquid crystal (= the dielectric constant $\epsilon_{\parallel}$ in a direction of a longer axis — the dielectric constant $\epsilon_{\perp}$ in a direction of a shorter axis) is $-0.2$.

The operating principle of the liquid crystal chopper having the construction as described above will be explained below.

When a voltage is applied between substrates 4b and 4c, an ion current is generated in the liquid crystal 4a. As a result, molecules 40a of the liquid crystal are greatly activated and infrared rays Ii incident upon the liquid crystal chopper 4 are scattered (FIG. 1(b)). More specifically, when no voltage is applied between the substrates 4b and 4c, a large amount of infrared rays Ip pass through the liquid crystal chopper 4 (FIG. 1(a)). However, when a voltage is applied between the substrates 4b and 4c, infrared rays hardly pass through the liquid crystal chopper 4 (FIG. 1(b)).

FIG. 2 shows the construction of an infrared sensor employing the above-described liquid crystal chopper.

In FIG. 2, reference 2 represents a pyroelectric element made of pyroelectric material such as $LiTaO_3$ or the like, and reference 7 represents an object to be measured which emits infrared rays. The liquid crystal chopper 4 of DSM type is provided in the halfway of the route of infrared rays 13 from the object 7 to the pyroelectric element 2. The infrared rays 13 emitted from the object 7 are intermittently radiated onto the pyroelectric element 2. An electric charge caused on the surface of the pyroelectric element 2 in accordance with the amount of radiated infrared rays thereto is amplified by an amplifier 15 and then sent to a control unit 16. The control unit 16 calculates the amount of radiated infrared rays as well as the temperature of the object 7, etc. from input signals, the result of which is given to a display unit 17.

In the above-described construction, when infrared rays emitted from the object 7 at 100° C. are intermittently radiated onto the pyroelectric element 2 by driving the liquid crystal chopper 4 with a voltage of 25 V having rectangular waveforms at a frequency of 1 Hz and room temperature is 25° C., a voltage of 950μV is obtained from the display unit 17 (in the case where the field of view of the pyroelectric element 2 is 27°). On the other hand, when the measurement is done under the same conditions as above with the use of a piezo-oscillator in place of the liquid crystal chopper 4, 800μV is obtained. Accordingly, it is clear that the liquid crystal chopper 4 serves and functions a great deal as a chopper.

Next, in order to confirm the characteristic of the DSM-type liquid crystal chopper 4, the characteristic is measured together with that of TN-type liquid crystal chopper. FIG. 3 is a diagram of a system for measuring the difference in the amount of infrared rays passing through the liquid crystal chopper with and without application of voltage thereto. This difference will be discussed later.

In FIG. 3, a detector 19 is provided to measure the intensity of infrared rays. The measured result with the use of the liquid crystal chopper made of 6 different liquid crystal materials is tabulated in Table 1.

TABLE 1

| | Name | Operation Type | $\Delta\epsilon$ | *** | $T_{on}$ | $T_{off}$ | * |
|---|---|---|---|---|---|---|---|
| A | Tisso LIXON-5018 | TN | +5.0 | 6.8% | 500 msec | 3 sec | 18 V |
| B | Tisso SA-9501 | TN | (unknown) | 6.9% | 500 msec | 3 sec | 18 V |
| C | Merk Jpn. NP-4 | DSM | −0.2 | 9.5% | 200 msec | 500 msec | 25 V |
| D | Merk Jpn. ZLI-389 | DSM | −0.44 | 4.2% | 1 sec | 2 sec | 25 V |
| E | Tisso EN-37 | DSM | −3.0 | 1.3% | 200 msec | 500 msec | 25 V |
| F | Merk Jpn. | DSM | −4.8 | 0% | — | — | 25V |

TABLE 1-continued

| Name | Operation Type | Δε | *** | $T_{on}$ | $T_{off}$ | * |
|------|----------------|-----|-----|----------|-----------|---|
| ZLI-2806 | | | | | | |

***Difference in Amount of Passing Infrared Rays
*Applied Voltage (AC 10 Hz)

In Table 1, Δε represents the dielectric anisotropy of the liquid crystal molecules of liquid crystal, and the difference in the amount of passing infrared rays is obtained by dividing the amount of passing infrared rays when the voltage is applied from which is subtracted the amount of passing infrared rays when no voltage is applied, by the amount of incident infrared rays. $T_{on}$ designates a rise time, while $T_{off}$ represents a fall time, each of which concretely holds the following value.

Supposing that the amount of infrared rays passing through the liquid crystal chopper 4 at a normal stationary state without application of voltage thereto is subtracted with the amount of passing infrared rays at a normal stationary state of the liquid crystal chopper 4 with the application of voltage is represented by ΔP, $T_{on}$ is a time required for the amount of passing infrared rays through the liquid crystal chopper 4 without the application of voltage to decline 0.9×ΔP after the application of voltage.

Meanwhile, $T_{off}$ is a time spent before the amount of passing infrared rays through the liquid crystal chopper 4 increases 0.9×ΔP after the voltage supply to the chopper is cut from the normal stationary state with the application of voltage.

As in understood from Table 1, two choppers A and B of TN type have relatively large difference in the amount of passing infrared rays, but it takes a large fall time $T_{off}$. Therefore, the TN-type liquid crystal choppers are not suitable for use in high speeds. On the other hand, with respect to the DSM-type liquid crystal choppers, the larger is the absolute value of the dielectric anisotropy Δε, the smaller becomes the difference in amount of passing infrared rays, resulting in inferior characteristic. However, the liquid crystal chopper C which is made of material having the dielectric anisotropy Δε of −0.2 has relatively large difference in the amount of passing infrared rays, with a short response time ($T_{on}$=200 msec., $T_{off}$=500 msec.).

Accordingly, if the DSM-type liquid crystal chopper is formed of material having the dielectric anisotropy Δε of −0.2 or so (−0.5≦Δε<0), it is suitable as the chopper mechanism in an infrared sensor using a pyroelectric element.

It is to be noted that the liquid crystal chopper of the present invention is applicable in various usage other than an infrared sensor. The liquid crystal chopper of the present invention is applicable in a thermopile, a thermisterholometer, an infrared camera and so like.

Hereinbelow, on preferred embodiment of the infrared sensor according to the present invention will be described.

Figure 4:
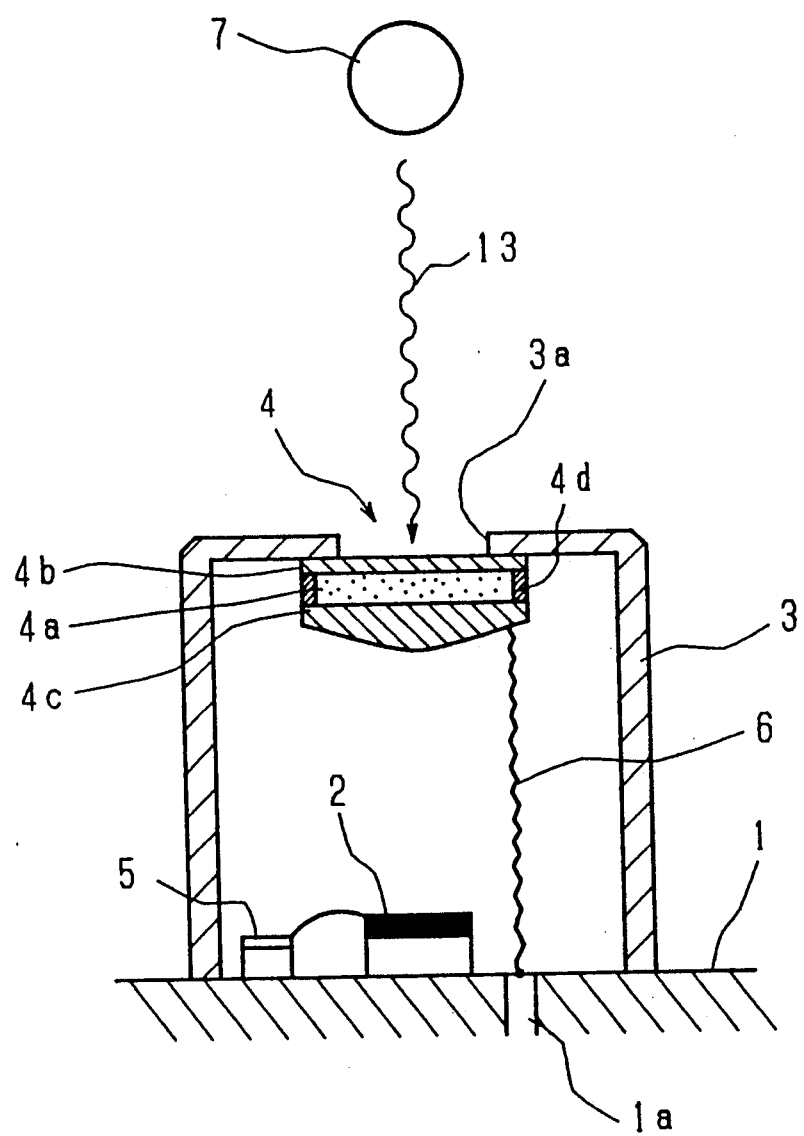
FIG. 4 is a sectional view of one example of the infrared sensor according to the present invention.

Referring to FIG. 4, the pyroelectric element 2 made of pyroelectric material such as LiTaO$_3$ or PZT ceramics, etc. is rigidly fixed onto a base 1. Moreover, a housing 3 is secured onto the base 1 in a manner to accommodate the pyroelectric element 2 thereinside. At the top portion of the housing 3 is formed a window 3a for guiding infrared rays therethrough to the pyroelectric element 2 via the liquid crystal chopper 4. The window 3a is located at a position to be aligned with the pyroelectric element 2 seen from a plane view. Moreover, the window 3a prevents the infrared rays from scattering at the liquid crystal chopper 4.

The liquid crystal chopper 4 is approximately in the same construction as the liquid crystal chopper shown in FIG. 1, except that the substrate 4b at the side of the object 7 is a flat plate, the substrate 4c at the side of the pyroelectric element 2 is protruding convexly only towards the pyroelectric element 2. The curvature of the substrate 4c or the distance between the substrate 4c and the pyroelectric element 2 is adjusted such that the focus of the substrate 4c meets on the pyroelectric element 2.

Furthermore, a processing circuit 5 is mounted on the base 1 inside the housing 3 so as to process the current obtained by the pyroelectric element 2, which is connected to the pyroelectric element 2 via a lead wire. The processing circuit 5 includes the amplifier 15 and control unit 16 indicated in FIG. 2. Moreover, an earth or grounding electrode 1a is provided with the base 1. A lead wire 6 connects the grounding electrode 1a and the substrate 4c. In consequence to this, noises generated at the liquid crystal chopper 4 can leak out to the grounding electrode 1a via the lead wire 6 from the substrate 4c.

The infrared sensor having the above-described construction operates in the following manner.

When the infrared sensor is used, the window 3a is directed opposite to the object 7 to be measured which emits infrared rays. The infrared rays emitted from the object 7 are, through the liquid crystal chopper 4 secured to and inside the window 3a, introduced into the housing 3. At this time, the emitted infrared rays are intermittently interrupted by the liquid crystal chopper 4, and therefore, the pyroelectric element 2 is given intermittent radiation of the infrared rays. As a result, an electric charge corresponding to the amount of radiated infrared rays is produced on the pyroelectric element 2. Then, by taking out the electric charge outside, the amount of emitted infrared rays from the object 7 is calculated in the processing circuit 5, based on which, for example, the temperature of the object 7 can be detected.

The reason why the substrate 4c is formed convex is described below.

In the case where no voltage is applied between the substrates 4b and 4c, infrared rays 13 pass through the liquid cyrystal chopper 4 without being scattered, proceeding to be collected onto the pyroelectric element 2 by the convex substrate 4c. On the contrary, when the voltage is applied between the substrates 4b and 4c, an ion current is generated in the liquid crystal 4a, thereby extremely moving the liquid crystal molecules of liquid crystal. Therefore, the infrared rays 13 incident upon the liquid crystal chopper 4 are scattered. Consequently, the infrared rays passing through the liquid crystal chopper 4 are not always collected on the pyroelectric element 2. The amount of infrared rays incident upon the pyroelectric element 2 is thus greatly changed depending on the presence or absence of the applied voltage to the substrates 4b and 4c. And the outputs of the detector 19 are also greatly changed, thereby to realize easy detection. Both the substrates 4b and 4c may be convex if only the infrared rays 13 are collected and focused onto the pyroelectric element 2.

The following description is related to the voltage to be applied to the liquid crystal chopper 4.

Since the liquid crystal chopper 4 becomes unable to interrupt the infrared rays if the application of voltage is elongated and the liquid cystal molecules are normally aligned, the driving voltage for the liquid crystal chopper 4 should be such that is reversed periodically. The driving circuit 18 shown in FIG. 2 (not shown in FIG. 4) produces such driving voltage.

The invention of the present invention have measured both the amount of passing infrared rays $Q_{ON}$ with the application of driving voltage and the amount of passing infrared rays $Q_{OFF}$ without the application of the driving voltage, by changing the waveforms of the driving voltage supplied from the driving circuit 18 to the liquid crystal chopper 4 in various manners, and obtained the difference therebetween. The liquid crystal of the liquid crystal chopper 4 was para-azoxyanisole, and the object 7 to be measured was a black body at 150° C. The amount of the infrared rays was measured by the detector 19 of FIG. 3.

Figure 5:
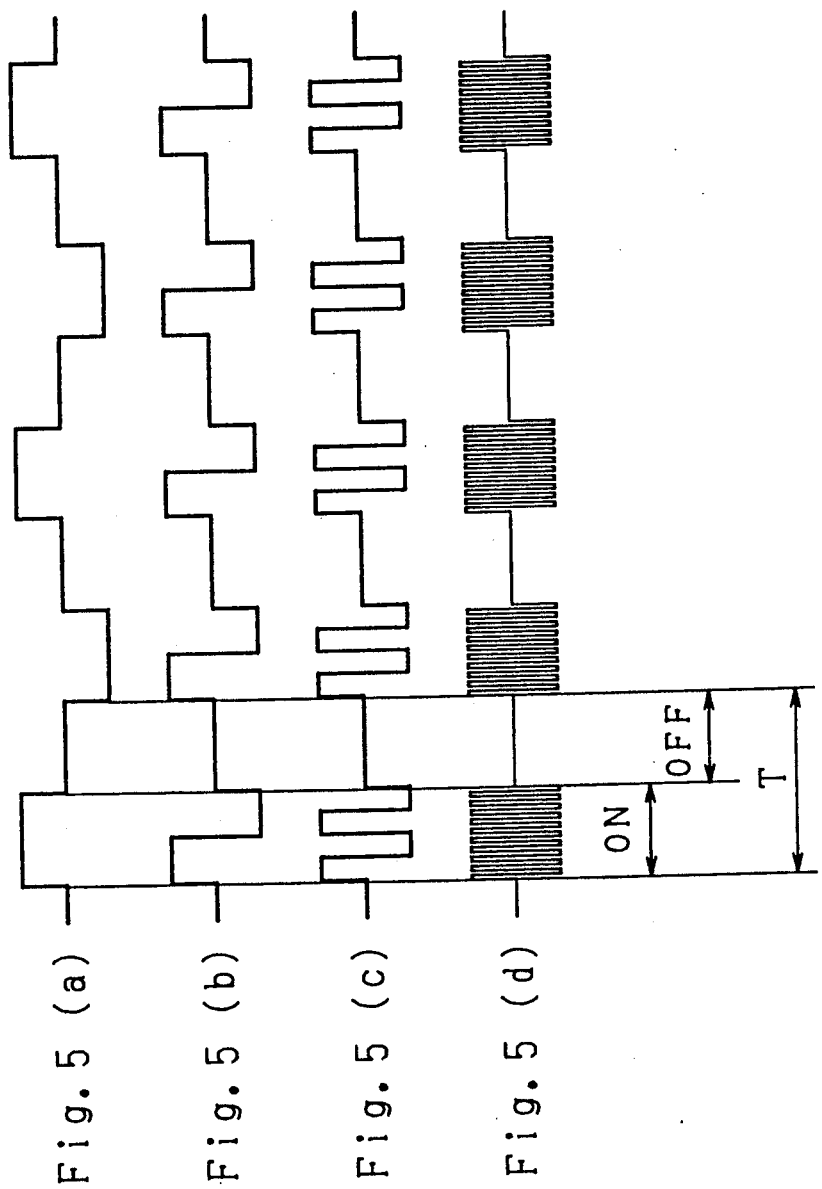
FIGS. 5(a), 5(b), 5(c) and 5(d) are waveforms of an driving voltage applied to a liquid crystal chopper.

As shown in FIG. 5, the driving voltage supplied by the driving circuit 18 repeats an application state (ON state) and a non-application state (OFF state) periodically. Moreover, a period T for one cycle of ON and OFF states is changed 1.0 sec., 0.67 sec., 0.50 sec. and 0.33 sec. The waveform of the driving voltage at the ON state is periodically changed in four manners, namely, positive voltage and negative voltage are continuously supplied (FIG. 5(a)); a cycle of positive voltage and negative voltage is repeated (FIG. 5(b)); a cycle of positive voltage and negative voltage is repeated twice (FIG. 5(c)); and a cycle of positive voltage and negative voltage is repeated ten times (FIG. 5(d)). The above positive and negative voltages are respectively 25V.

Figure 6:
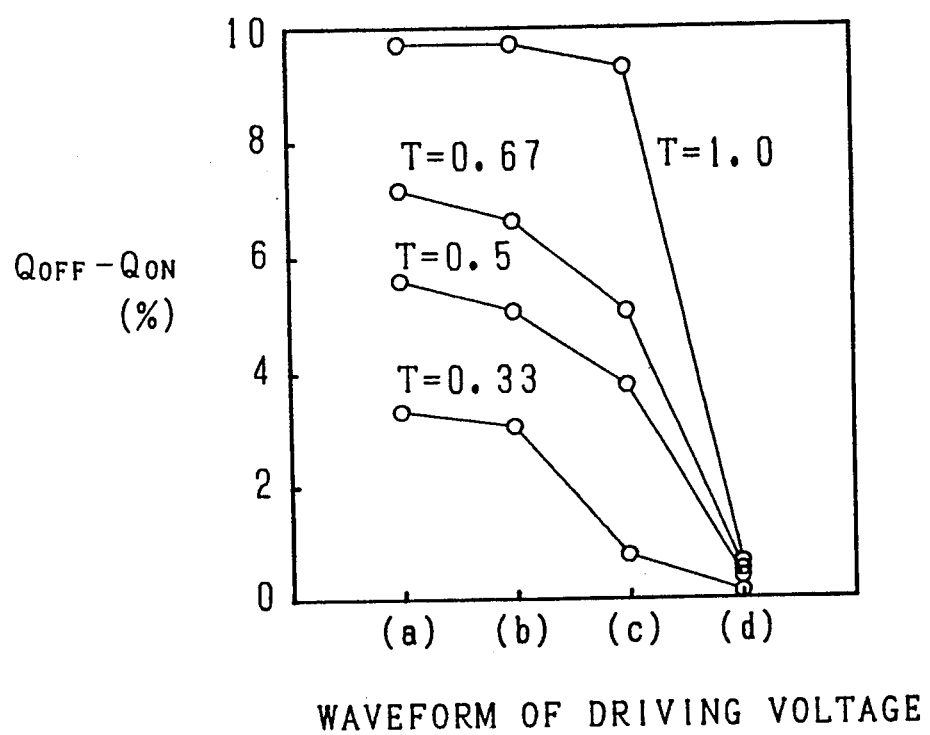
FIG. 6 is a graph showing the infrared ray transmission of a liquid crystal chopper driven by various kinds of driving voltage.

When the liquid crystal chopper 4 is driven by the respective driving voltage as mentioned above, the amount of passing infrared rays $Q_{OFF}$ and $Q_{ON}$ are measured. The difference ($Q_{OFF}-Q_{ON}$) is indicated in a graph of FIG. 6 in which the longitudinal axis indicates the difference by % based on the reference of infrared rays emitted from the black body 7, while the vertical axes (a)-(d) correspond to FIGS. 5(a) -5(d), respectively. From the graph, it is found that the value ($Q_{OFF}-Q_{ON}$) is increase in accordance with the increase of the period T for every waveform of driving voltage, and it increases on a large scale when the driving voltage of the waveform shown in FIG. 5(a) is supplied with the same period T in comparison with the other cases.

As mentioned above, now that it becomes clear that the difference in the transmission of infrared rays through the liquid crystal chopper 4 is made large when the driving voltage which repeats positive voltage, 0 voltage, negative voltage and 0 voltage as shown in FIG. 5(a) is employed, an influence of the period T to the infrared sensor of FIG. 4 is further detected. For this purpose, the driving voltage having the waveform shown in FIG. 5(a) and 8 different periods T from 1.0 sec. to 0.33 sec. is applied to the liquid crystal chopper 4 from the driving circuit 18, and the outputs obtained at the pyroelectric element 2 at this time are measured. The result is shown in Table 2 below.

TABLE 2

| Period T (sec) | 1.0 | 0.9 | 0.8 | 0.7 |
|---|---|---|---|---|
| Output (μV) | 1910 | 2000 | 2080 | 2150 |
| Period T (sec) | 0.6 | 0.5 | 0.4 | 0.33 |
| Output (μV) | 2140 | 1760 | 1200 | 970 |

From the result of the experiments, it is made clear that, although the transmission difference of infrared rays by the liquid crystal chopper 4 is increased in accordance with the increase of the period T within 1.0 sec., a peak of outputs obtained at the pyroelectric element 2 is observed when the period T is about 0.6–0.7 sec. This is because the sensitivity of the pyroelectric element 2 made of $LiTaO_3$ has its peak around 3 Hz (T=0.33 sec.). In other words, if the period T of the driving voltage of the liquid crystal chopper 4 is determined in relation to the sensitivity of the pyroelectric element 2, possibly high output can be obtained at the pyroelctric element 2.

The infrared sensor according to the present invention is further arranged with a countermeasure against noises, which will be described hereinbelow.

Figure 7:
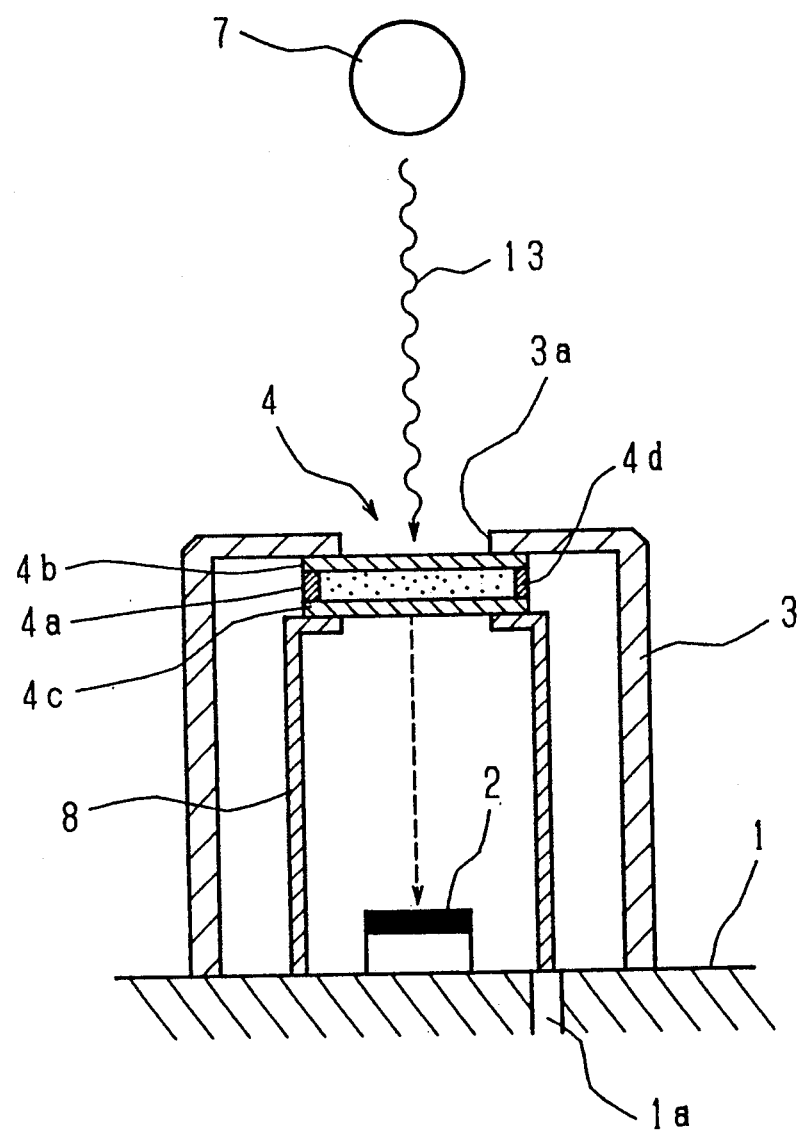
FIG. 7 is a sectional view of another example of the infrared sensor according to the present invention.

In the infrared sensor of FIG. 4, the grounding electrode 1a and substrate 4c are connected through the lead wire 6, so that the noises generated at the liquid crystal chopper 4 are removed through the lead wire 6 and grounding electrode 1a. Another example is shown in FIG. 7. According to the embodiment of FIG. 7, there is provided a metallic cylindrical body 8 which is electrically conductive between the peripheral edge of the substrate 4c and the base 1. A portion of the cylindrical body 8 is connecdted to the grounding electrode 1a. Therefore, also in this embodiment, noises generated at the liquid crystal chopper 4 are removed through the cylindrical body 8 and grounding electrode 1a.

Table 3 indicates the results of evaluation test against noises of the infrared sensor according the present invention.

Figure 8:
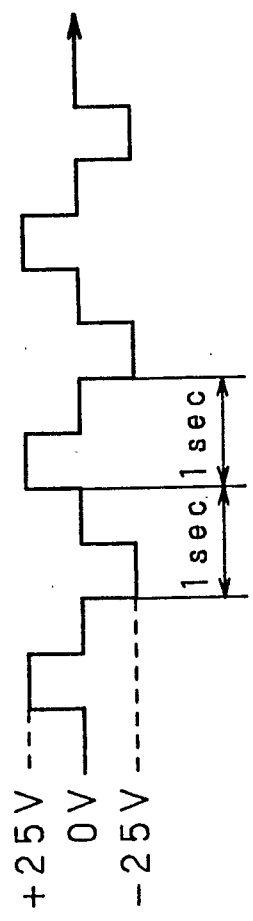
FIG. 8 is a waveform of one example of a driving voltage applied to the liquid crystal chopper.

In the test, the grounding condition shown in FIG. 7 is employed. The field of view of the pyroelectric element 2 through the window 3a is 22.4° and the object 7 to be measured is a black body at the surface temperature of 100° C. Moreover, the liquid crystal of the DSM-type chopper 4 is para-azoxyanisole, which is driven by the driving voltage of rectangular waveforms repeating a cycle of +25 V, OV, −25 V and OV in this order every two seconds as shown in FIG. 8.

TABLE 3

|  | Present Infrared Sensor | Comparison 1 | Comparison 2 | Comparison 3 |
|---|---|---|---|---|
| Noise (μV) | 5 or less | 50 | 50 | 5 or less |
| Output (μV) | 710 | 710 | 710 | 500 |
| S/N Ratio (dB) | 43 or more | 23 | 23 | 40 or more |

In Table 3, comparisons 1–3 are infrared sensors subjected to the evaluation test under the same conditions as the infrared sensor of this invention. The comparison 1 has substrates 4b and 4c not grounded to the earth. The comparison 2 had the substrate 4b, not the substrate 4c at the side of the pyroelectric element 2, grounded to the earth. Further, the comparison 3 has the substrates 4b and 4c not grounded, but is provided with a shield box to enclose the pyroelectric element 2 to shut the noises.

According to the infrared sensor of the present invention as compared with the comparisons 1 and 2, noises overlapping with the output signals are reduced to a large extent, whereby a high S/N ratio is obtained. Moreover, since the noises of the same level are observed both in the comparisons 1 and 2 wherein the substrate 4b is grounded and, none of the substrates 4b and 4c is grounded, respectively, it is seen that the overlapping noises can be reduced by grounding the substrate 4c at the side of the pyroelectric element 2.

In the comparison 3 provided with the shield box, although the overlapping noises of the same level as in the present invention are found, the level of output signals is lowered in comparison with the of the present invention and comparisons 1 and 2. This is because the shield box partly interrupts the radiated infrared rays onto the pyroelectric element 2.

The similar result is obtained also in the infrared sensor having the grounding condition of FIG. 4 to that shown in Table 3. Accordingly, the overlapping noises with output signals are reduced remarkably irrespective of the grounding condition.

Although the evaluation result of Table 3 is based on the DSM-type liquid crystal chopper 4, it is possible to greatly reduce the output noises also in the TN-type liquid crystal chopper 4 by grounding the substrate 4c at the side of the pyroelectric element 2.

The reason why the window 3a is formed will be explained below.

An output characteristic of the infrared sensor of this invention provided with the window 3a is compared with that of the conventional infrared sensor without either the housing 3 or the window 3a. The object 7 to be measured is a black body at the surface temperature of 100° C., and the liquid crystal chopper 4 is driven by the driving voltage of rectangular waveforms shown in FIG. 8.

Figure 9:
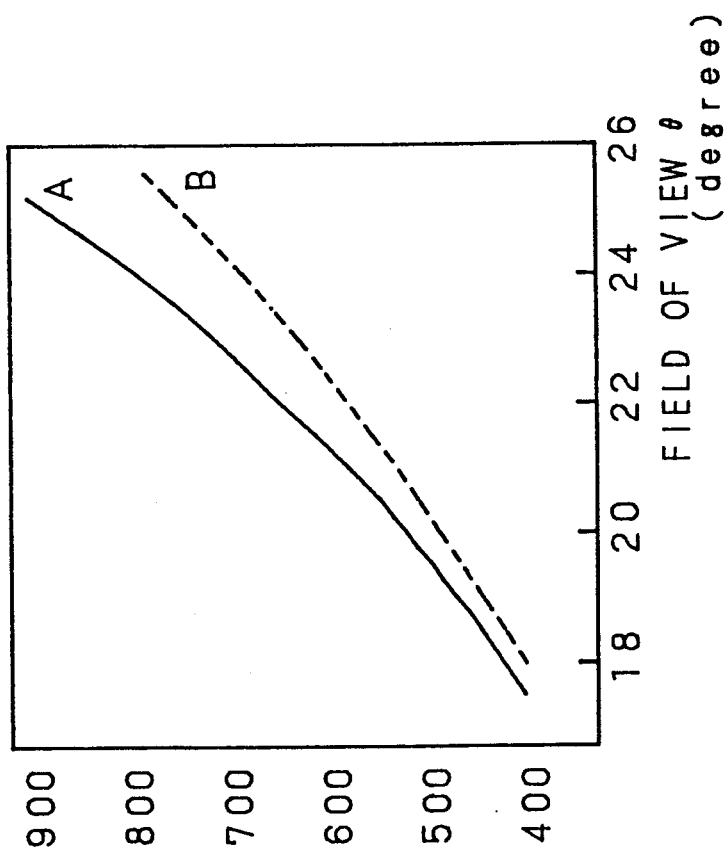
FIG. 9 is a graph showing an output characteristic when field of view is changed.

The result is indicated in FIG. 9 which shows the relation between the field of view $\theta(18°-26°)$ and an output ($\mu V$). A solid line A indicates the characteristic of the present invention sensor, and a broken line B indicates the characteristic of the conventional infrared sensor. If the field of view is the same, the output of the infrared sensor of this invention is larger.

Figure 10:
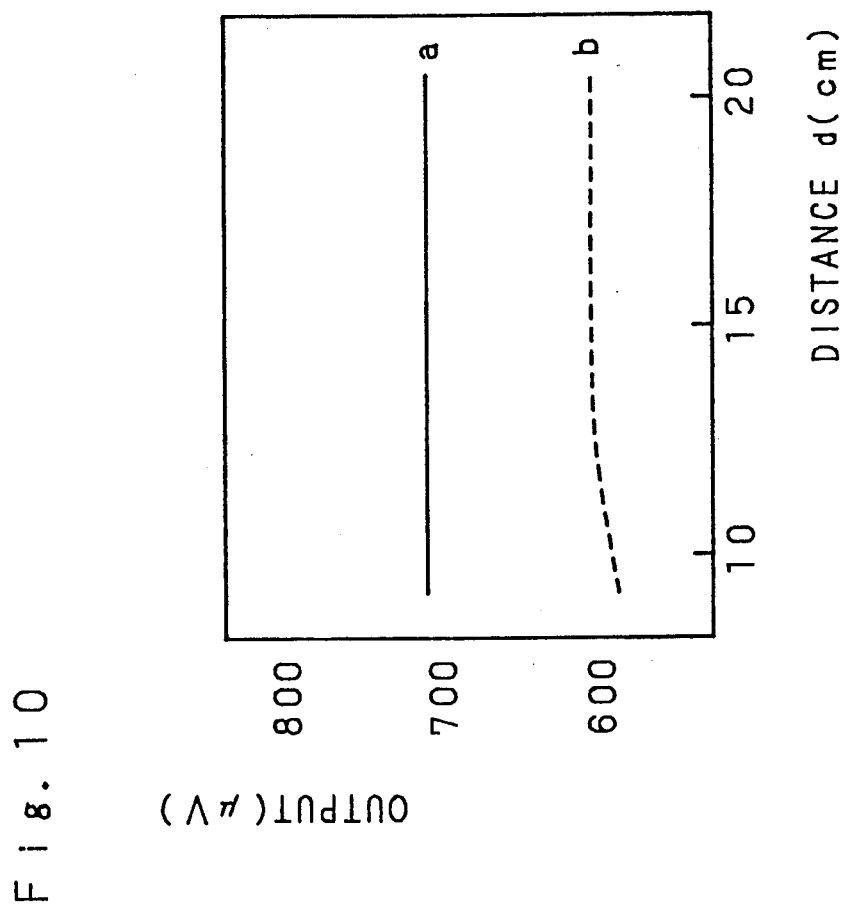
FIG. 10 is a graph showing an output characteristic when the distance between the infrared sensor and an object to be measured is changed.

Next, the relation between the distance d(cm) from the sensor to the object 7, and the output ($\mu V$) when the field of view is fixed 22.4° is indicated in FIG. 10. It is found out from this FIG. 10 that the output of the infrared sensor of the present invention shown by a solid line a is more stable than that of the conventional infrared sensor shown by a broken line b which is dependent on the distance, and therefore the conventional infrared sensor exerts poor efficiency.

The thickness of the housing 3 is determined for the reason below.

Referring to FIG. 11, the output characteristic of the present infrared sensor after infrared rays enter from the window 3a of the housing 3 before they reach the liquid crystal chopper 4 is shown when the thickness of the housing 3 is changed. The thicker is the housing 3, the larger is the output.

Meanwhile, FIG. 12 indicates lateral sectional views of three kinds of sensors for comparison of an output therefrom. In other words, FIG. 12(a) shows the conventional infrared sensor, FIG. 12(b) shows the present infrared sensor with the thickness of the housing 3 reduced, and FIG. 12(c) indicates the present infrared sensor with the thickness of the housing 3 increased. When the field of view and the distance between the sensor and object 7 are constant, the outputs from the sensors result in a <b <c. Accordingly, when the application of voltage is started to the DSM-type liquid crystal chopper (the liquid crystal chopper is closed), infrared rays from outside the viewfield are scattered by the chopper to reach the sensor. Therefore, if the housing is rendered thick so as to prevent the infrared rays from scattering at the liquid crystal choooper, the sensor can generate high outputs, with improving the accuracy.

As is fully described hereinabove, the liquid crystal chopper according to the present invention can realize a chopper machanism compact in size and small in electric power consumption. Moreover, the liquid crystal chopper is driven by DSM, and therefore a short response time is achieved. Further, because no deflecting plate is necessary, the liquid crystal chopper becomes simple in structure with low manufacturing cost.

Furthermore, in the infrared sensor of the present invention employing the above liquid crystal chopper, outputs with high S/N ratio and without being overlapped with noises can be obtained, thus improving the detecting accuracy.

As this invention may be embodiment in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. An infrared sensor comprising:
   a base;
   a pyroelectric element mounted on said base.
   a liquid crystal chopper disposed above said pyroelectric element, said liquid crystal chopper comprising a pair of confronting electrically conductive substrates, spacer means disposed between said conductive substrates for keeping said electrically conductive substrates spaced a predetermined distance and defining a space therebetween, and a liquid crystal enclosed in said space;
   wherein one of said pair of electrically conductive substrates disposed nearest said pyroelectric element is grounded.

2. An infrared sensor as set forth in claim 1, wherein at least one of said pair of electrically conductive substrates is convex.

3. An infrared sensor as set forth in claim 1, wherein said electrically conductive substrate disposed nearest said pyroelectric element is convex.

4. An infrared sensor as set forth in claim 1, wherein said liquid crystal is a DSM type liquid crystal.

5. An infrared sensor as set forth in claim 1, wherein said liquid crystal is formed of pare-azoxyanisole.

6. An infrared sensor as set forth in claim 1, wherein the dielectric anisotropy of said liquid crystal is between $-0.5$ and $0$.

7. An infrared sensor as set forth in claim 4, wherein the dielectric anistropy of said liquid cyrstal is between $-0.5$ and $0$.

8. An infrared sensor as set forth in claim 1, further comprising voltage application means for repeatedly applying a positive voltage, 0 voltage, a megative voltage, and 0 voltage at a predetermined period to said pair of electrically conductive substrates.

9. An infrared sensor as set forth in claim 8 wherein said period is selected based on the sensitivity of said pyroelectric element.

10. An infrared sensor as set forth in claim 1, further comprising a grounding electrode disposed in said base and a leas wire connected between said electrically conductive substrate disposed nearest to said pyroelectric element and said grounding electrode.

11. An infrared sensor as set forth in claim 1, further comprising a grounding electrode disposed in said base and an electrically conductive cylindrical body disposed between said electrically conductive substrate disposed nearest to said pyroelectric element and said grounding electrode, said cylindrical body connecting said electrically conductive substrate to said grounding electrode.

* * * * *

UNITED STATES PATENT AND TRADEMARK OFFICE
CERTIFICATE OF CORRECTION

PATENT NO. : 5,036,199

DATED : July 30, 1991

INVENTOR(S) : Masakazu SAKATA et al

It is certified that error appears in the above-identified patent and that said Letters Patent is hereby corrected as shown below:

On the cover page, Item [75], fourth line, "Toshikazu" should read -- Yoshikazu --.

Signed and Sealed this

Twenty-sixth Day of January, 1993

Attest:

STEPHEN G. KUNIN

*Attesting Officer*     *Acting Commissioner of Patents and Trademarks*